(12) United States Patent
Wang

(10) Patent No.: US 11,394,007 B2
(45) Date of Patent: Jul. 19, 2022

(54) ORGANIC LIGHT EMITTING DIODE DISPLAY PANEL

(71) Applicant: Wuhan China Star Optoelectronics Semiconductor Display Technology Co., Ltd., Wuhan (CN)

(72) Inventor: Junyuan Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/476,278

(22) PCT Filed: Apr. 26, 2019

(86) PCT No.: PCT/CN2019/084513
§ 371 (c)(1),
(2) Date: Jul. 6, 2019

(87) PCT Pub. No.: WO2020/133848
PCT Pub. Date: Jul. 2, 2020

(65) Prior Publication Data
US 2021/0408450 A1 Dec. 30, 2021

(30) Foreign Application Priority Data
Dec. 29, 2018 (CN) .......................... 201811640486.X

(51) Int. Cl.
*H01L 51/52* (2006.01)
*H01L 27/32* (2006.01)
(Continued)

(52) U.S. Cl.
CPC ...... *H01L 51/5253* (2013.01); *H01L 27/3234* (2013.01); *H01L 27/3246* (2013.01);
(Continued)

(58) Field of Classification Search
CPC . H01L 27/32; H01L 27/3234; H01L 27/3246; H01L 27/3258; H01L 51/0096;
(Continued)

(56) References Cited

U.S. PATENT DOCUMENTS

2017/0237038 A1* 8/2017 Kim .................... H01L 51/5253
257/40
2018/0124933 A1 5/2018 Park et al.
(Continued)

FOREIGN PATENT DOCUMENTS

CN 107452894 A 12/2017
CN 107658332 A 2/2018
(Continued)

*Primary Examiner* — Vongsavanh Sengdara
(74) *Attorney, Agent, or Firm* — Nathan & Associates; Menachem Nathan

(57) ABSTRACT

An organic light emitting diode display panel is provided and includes a display region and a through hole configured to receive an electronic element. The display region is disposed around a periphery of the through hole and includes a barrier structure and an encapsulation structure layer covering the barrier structure. The barrier structure is disposed on a side of a periphery of the through hole. The present invention, by extending the encapsulation structure layer from the display region to the barrier structure to cover the barrier structure, prevents water from invading an organic light emitting layer of the display region through the through hole.

10 Claims, 10 Drawing Sheets

(51) Int. Cl.
*H01L 51/00* (2006.01)
*H01L 51/56* (2006.01)

(52) U.S. Cl.
CPC ...... *H01L 27/3258* (2013.01); *H01L 51/0096* (2013.01); *H01L 51/56* (2013.01); *H01L 2227/323* (2013.01)

(58) Field of Classification Search
CPC ..... H01L 51/5253; H01L 51/56; H01L 51/52; H01L 2227/323
See application file for complete search history.

(56) References Cited

U.S. PATENT DOCUMENTS

2019/0123115 A1  4/2019  Sun et al.
2019/0333972 A1  10/2019  Ding et al.
2020/0006704 A1* 1/2020  Zhang ................ H01L 27/3244

FOREIGN PATENT DOCUMENTS

| CN | 108039418 A | 5/2018 |
|----|----|----|
| CN | 108666347 A | 10/2018 |
| CN | 108666352 A | 10/2018 |
| KR | 100929168 B1 | 12/2009 |
| KR | 20180115387 A | 10/2018 |

* cited by examiner

ORGANIC LIGHT EMITTING DIODE DISPLAY PANEL

FIELD OF INVENTION

The present invention relates to a display technology, especially to an organic light emitting diode (OLED) display panel.

BACKGROUND OF INVENTION

In a conventional organic light emitting diode (OLED) display panel, for an O-cut (opening) screen, there is no existing corresponding mask, and an OLED light emitting diode layer thereof is easily affected by external water. After an OLED device is processed by a thin film encapsulation (TFE) process, an O-cut process would make a side of the O-cut opening unprotected by the TFE, which results in invasion of water and failure of the OLED device.

SUMMARY OF INVENTION

The present invention embodiment provides an organic light emitting diode (OLED) display panel to solve a technical issue that after an OLED device is processed by a thin film encapsulation (TFE) process, an O-cut process would make a side of the O-cut opening, which results in water invasion and failure of the OLED device.

The present invention embodiment provides an organic light emitting diode (OLED) display panel, comprising:

a display region and a through hole configured to receive an electronic element, wherein the display region is disposed around a periphery of the through hole;

the display region comprising a barrier structure and an encapsulation structure layer covering the barrier structure, wherein the barrier structure is disposed on a side of the periphery of the through hole;

the barrier structure comprising a first unit and a second unit disposed on the first unit, wherein the encapsulation structure layer covers the second unit;

the encapsulation structure layer comprising a first inorganic layer, an organic layer and a second inorganic layer disposed on the organic layer, wherein the first inorganic layer and/or the second inorganic layer covers the second unit;

wherein the first inorganic layer and/or the second inorganic layer is a single layered structure or a multi-layered structure.

In the OLED display panel of the present invention, the first unit comprises an edge region, the edge region is a portion of the first unit exceeding the second unit along a direction toward the through hole, and the edge region comprises a first surface, and the first surface faces the second unit; and the first inorganic layer and/or the second inorganic layer is connected to the first surface.

In the OLED display panel of the present invention, the display region comprises a displaying function structure, the displaying function structure comprises a cathode layer, the first inorganic layer is disposed on the cathode layer, the cathode layer extends to the barrier structure and covers the second unit, and the cathode layer extends to the edge region and is connected to the first surface.

In the OLED display panel of the present invention, the edge region is recessed with a notch, the first inorganic layer and/or the second inorganic layer extends in the notch and is connected to the notch.

In the OLED display panel of the present invention, the first surface of the edge region is recessed with a notch, the cathode layer is connected to the first surface, and the first inorganic layer and/or the second inorganic layer extends in the notch and is connected to the notch.

In the OLED display panel of the present invention, the display region comprises a substrate, an interlayer dielectric layer disposed on the substrate, a planarization layer disposed on the interlayer dielectric layer and at least one barrier wall disposed on the planarization layer, the first unit comprises the substrate and the interlayer dielectric layer, and portions of the substrate and the interlayer dielectric layer exceeding the planarization layer form the edge region.

In the OLED display panel of the present invention, the display region further comprises a displaying function structure configured to display light, the displaying function structure is disposed on a side of a periphery of the barrier structure facing away from the through hole, the second unit comprises the planarization layer and the barrier wall, the displaying function structure comprises a pixel definition layer disposed on the planarization layer, and the barrier wall and the pixel definition layer are disposed in a same layer.

In the OLED display panel of the present invention, the barrier wall and the pixel definition layer are made by a same mask.

The present invention embodiment also provides an organic light emitting diode (OLED) display panel, comprising:

a display region and a through hole configured to receive an electronic element, wherein the display region is disposed around a periphery of the through hole; and the display region comprising a barrier structure and an encapsulation structure layer covering the barrier structure, wherein the barrier structure is disposed on a side of the periphery of the through hole.

In the OLED display panel of the present invention, the barrier structure comprises a first unit and a second unit disposed on the first unit, wherein the encapsulation structure layer covers the second unit.

In the OLED display panel of the present invention, the encapsulation structure layer comprises a first inorganic layer, an organic layer and a second inorganic layer disposed on the organic layer, wherein the first inorganic layer and/or the second inorganic layer covers the second unit.

In the OLED display panel of the present invention, the first unit comprises an edge region, the edge region is a portion of the first unit exceeding the second unit along a direction toward the through hole, and the edge region comprises a first surface, and the first surface faces the second unit; and the first inorganic layer and/or the second inorganic layer is connected to the first surface.

In the OLED display panel of the present invention, the display region comprises a displaying function structure, the displaying function structure comprises a cathode layer, the first inorganic layer is disposed on the cathode layer, the cathode layer extends to the barrier structure and covers the second unit, and the cathode layer extends to the edge region and is connected to the first surface.

In the OLED display panel of the present invention, the edge region is recessed with a notch, the first inorganic layer and/or the second inorganic layer extends in the notch and is connected to the notch.

In the OLED display panel of the present invention, the first surface of the edge region is recessed with a notch, the cathode layer is connected to the first surface, and the first inorganic layer and/or the second inorganic layer extends in the notch and is connected to the notch.

In the OLED display panel of the present invention, the edge region is recessed with a notch, the cathode layer extends in the notch and is connected to the notch, the cathode layer is connected to the first surface, and the first inorganic layer and/or the second inorganic layer extends in the notch and is connected to the notch.

In the OLED display panel of the present invention, the notch includes a first notch portion and a second notch portion, a depth of the first notch portion is different from a depth of the second notch portion; the first inorganic layer extends in the first notch portion and is connected to the first notch portion, and the second inorganic layer extends in the second notch portion and is connected to the second notch portion.

In the OLED display panel of the present invention, the notch comprises a first notch portion and a second notch portion, a depth of the first notch portion is different from a depth of the second notch portion; the first inorganic layer and the cathode layer extend in the first notch portion and are connected to the first notch portion, the second inorganic layer extends in the second notch portion and is connected to the second notch portion.

In the OLED display panel of the present invention, the notch comprises a first notch portion and a second notch portion, a depth of the first notch portion is different from a depth of the second notch portion; the cathode layer extends in the first notch portion and is connected to the first notch portion, the first inorganic layer and the second inorganic layer extend in the second notch portion and are connected to the second notch portion.

In the OLED display panel of the present invention, a depth of the first notch portion is less than a depth of the second notch portion.

In the OLED display panel of the present invention, the display region comprises a substrate, an interlayer dielectric layer disposed on the substrate, a planarization layer disposed on the interlayer dielectric layer and at least one barrier wall disposed on the planarization layer, the first unit comprises the substrate and the interlayer dielectric layer, and portions of the substrate and the interlayer dielectric layer exceeding the planarization layer form the edge region.

In the OLED display panel of the present invention, the display region further comprises a displaying function structure configured to display light, the displaying function structure is disposed on a side of a periphery of the barrier structure facing away from the through hole, the second unit comprises the planarization layer and the barrier wall, the displaying function structure comprises a pixel definition layer disposed on the planarization layer, and the barrier wall and the pixel definition layer are disposed in a same layer.

In the OLED display panel of the present invention, the barrier wall and the pixel definition layer are made by a same mask.

In the OLED display panel of the present invention, the displaying function structure further comprises the substrate, the interlayer dielectric layer, the planarization layer, the pixel definition layer, an organic light emitting layer and a cathode layer disposed sequentially.

Compared to a conventional OLED display panel, the OLED display panel of the present invention, by extending the encapsulation structure layer from the display region to the barrier structure to cover at least a part of the barrier structure, prevents water from entering the organic light emitting layer of the display region through the through hole, which solve the technical issue that for a conventional O-cut screen, after an OLED device undergoes a TFE encapsulation process, implementing the an O-cut process would make a side of the O-cut screen lose protection of the TFE such that water invasion causes failure of the OLED.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
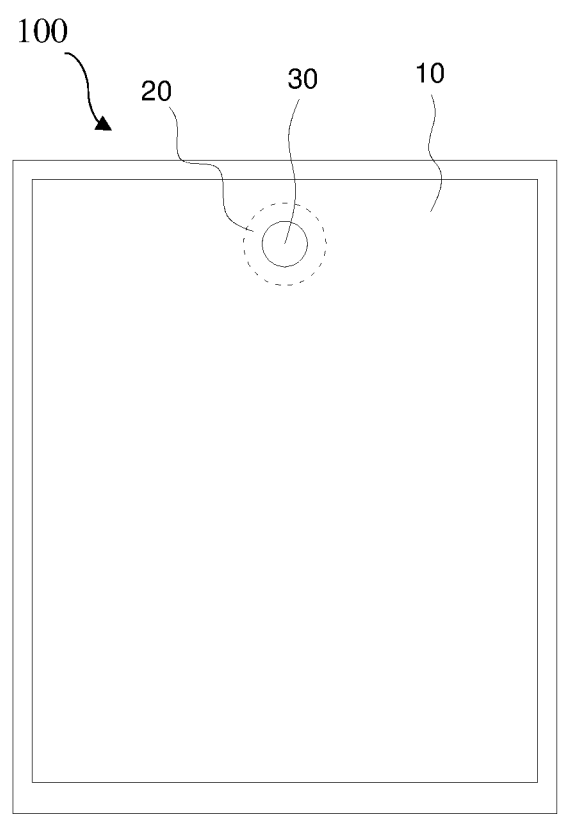
FIG. 1 is a schematic structural view of an organic light emitting diode (OLED) display panel of a first embodiment of the present invention.

With reference to figures in the appended drawings, the same reference character refers to the same element. The following description is accordance with exemplary specific embodiments of the present invention and shall not be deemed as limitations to other specific embodiments of the present invention not descried herein.

Figure 2:
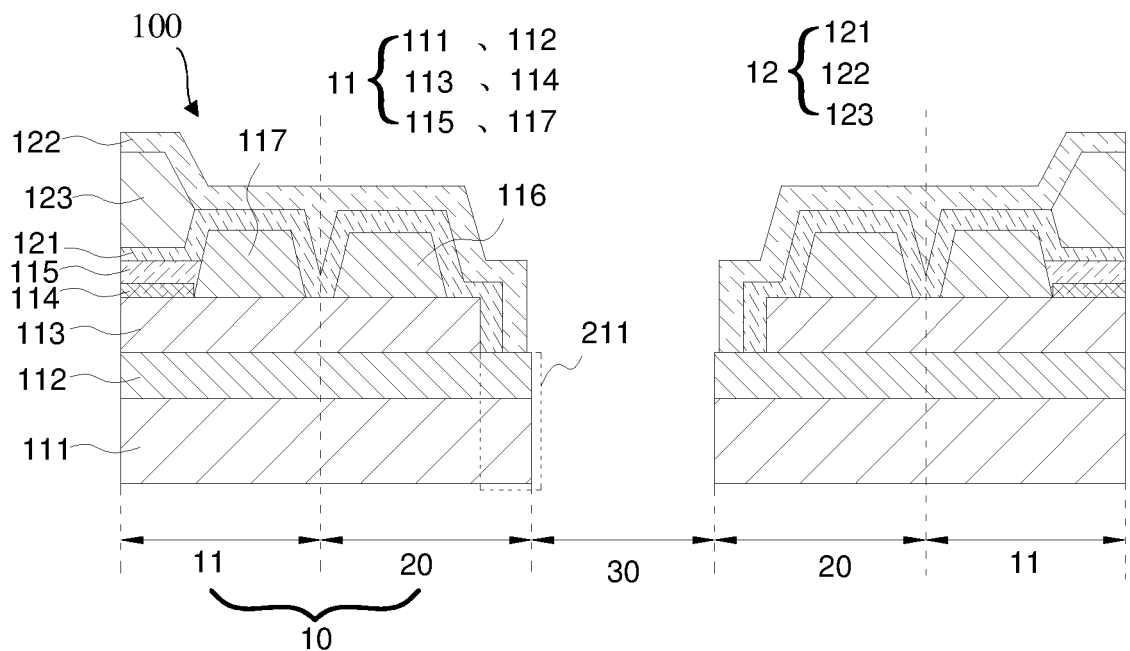
FIG. 2 is another schematic structural view of the OLED display panel of the first embodiment of the present invention.

With reference to FIGS. 1 and 2, FIG. 1 is a schematic structural view of an organic light emitting diode (OLED) display panel of a first embodiment of the present invention; FIG. 2 is another schematic structural view of the OLED display panel of the first embodiment of the present invention.

An OLED display panel 100 of the first embodiment of the present invention includes a display region 10 and a through hole 30 configured to receive an electronic element. The through hole 30 is defined through a displaying function structure 11 and an encapsulation structure layer 12 of the display panel 100. The display region 10 is disposed around a periphery of the through hole 30.

The display region 10 includes a barrier structure 20 and an encapsulation structure layer 12 covering the barrier structure 20. The barrier structure 20 is disposed on a side of the periphery of the through hole 30.

The encapsulation structure layer 12 covers the displaying function structure 11. encapsulation structure layer 12 extends from the displaying function structure 11 to the barrier structure 20 and covers the barrier structure 20 to prevent water from entering an organic light emitting layer 114 of the display region 10 through the through hole 30. The encapsulation structure layer 12 covering the barrier structure 20 can cover a portion of the barrier structure 20 or alternatively can cover the entire barrier structure 20.

In the OLED display panel 100 of the first embodiment, by extending the encapsulation structure layer 12 from the displaying function structure 11 to the barrier structure 20 to cover at least one part of the barrier structure 20 and making the encapsulation structure layer 12 to cover the entire displaying function structure 11, the encapsulation structure layer 12 at least covers the organic light emitting layer 114, prevents water from entering a side of the barrier structure 20 through the through hole 30 and further entering the organic light emitting layer 114 of the displaying function structure 11.

It is to be understood that the encapsulation structure layer 12 covers at least one portion of the barrier structure 20 such that a sidewall of the barrier structure 20 (the encapsulation structure layer 12 on a side of the barrier structure 20) becomes a portion of a wall of the through hole 30. Furthermore, a height of a bottom surface of the sidewall is required to be lower than a height of a bottom surface of the organic light emitting layer 114. The height of the bottom surface is defined relative to a level on which a substrate 111 is located.

In the first embodiment, the barrier structure 20 includes a first unit 21 and a second unit 22 disposed on the first unit 21. The encapsulation structure layer 12 covers the second unit 22. The encapsulation structure layer 12 covers the second unit 22 such that a sidewall of the second unit 22 (the encapsulation structure layer 12 located on a side of the second unit 22) becomes a portion of the wall of the through hole 30. Furthermore, a height of the bottom surface of the sidewall is required to be lower than a height of the bottom surface of the organic light emitting layer 114. The height of the bottom surface is defined relative to a level on which the substrate 111 is located.

In the first embodiment, the encapsulation structure layer 12 includes a first inorganic layer 121, an organic layer 123 and a second inorganic layer 122 disposed on the organic layer 123. The first inorganic layer 121 and/or second inorganic layer 122 covers the second unit 22. The organic layer 123 is correspondingly disposed in a region of the displaying function structure 11.

Structures of the encapsulation structure layer 12 performing a function of blocking water are the first inorganic layer 121 and the second inorganic layer 122. Therefore, only one of these structures covers the second unit 22 can the function of blocking water from entering the display region 10 be performed to improve water-blocking effect. In the first embodiment, the first inorganic layer 121 and the second inorganic layer 122 are employed to commonly cover the second unit 22.

Material of the first inorganic layer 121 and the second inorganic layer 122 is a thin film having an excellent water oxygen repellent ability, and material of the layers can be selected from a group consisting of $AlO_x$, $SiN_x$, $SiON_x$, $HfO_x$, $TiO_x$, and a combination thereof. In other words, the first inorganic layer 121 and the second inorganic layer 122 can be a single layered structure, or alternatively, can be a multi-layered structure.

Figure 3:
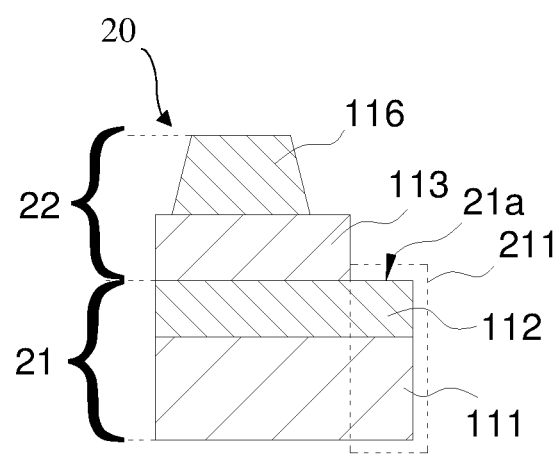
FIG. 3 is a schematic view of a barrier structure of the OLED display panel of the first embodiment of the present invention.

With reference to FIG. 3, in the first embodiment, the first unit 21 includes an edge region 211. The edge region 211 is a portion of the first unit 21 exceeding the second unit 22 along a direction toward the through hole 30. The edge region 211 includes a first surface 21a. The first surface 21a faces the second unit 22.

The first inorganic layer 121 and/or second inorganic layer 122 is connected to the first surface 21a.

In the first embodiment, the first inorganic layer 121 and the second inorganic layer 122 cover the second unit 22 extend to the first surface 21a, and are connected to the first surface 21a to form a structure entirely covering the second unit 22, which increasing a sealing ability.

Of course, in some embodiments, one of the first inorganic layer and the second inorganic layer is connected to the first surface.

In the first embodiment, the display region 10 includes a substrate 111, an interlayer dielectric layer 112 disposed on the substrate 111, a planarization layer 113 disposed on the interlayer dielectric layer 112 and at least one barrier wall 116 disposed on the planarization layer 113.

The first unit 21 includes the substrate 111 and the interlayer dielectric layer 112. The edge region 211 is a portion of the substrate 111 and the interlayer dielectric layer 112 exceeding the planarization layer 113. In other words, the portion of the substrate 111 and the interlayer dielectric layer 112 exceeding the planarization layer 113 form the edge region 211.

The display region 10 further includes the displaying function structure 11 configured to display light. The displaying function structure 11 is disposed on a side of a periphery of the barrier structure 20 facing away from the through hole 30.

The second unit 22 includes the planarization layer 113 and the barrier wall 116. displaying function structure 11 includes a pixel definition layer 117 disposed on the planarization layer 113;

The barrier wall 116 and the pixel definition layer 117 are disposed in a same layer. Furthermore, the barrier wall 116 and the pixel definition layer 117 are made by a same mask. Such arrangement improves process efficiency and lower the cost.

Therefore, the displaying function structure 11 includes the substrate 111, the interlayer dielectric layer 112, the planarization layer 113, the pixel definition layer 117, the organic light emitting layer 114, and a cathode layer 115. The organic light emitting layer 114 is disposed in an opening of the pixel definition layer 117. The cathode layer 115 is disposed on the organic light emitting layer 114.

The second unit 22 includes the planarization layer 113 and the barrier wall 116.

Of course, in some embodiments, the second unit can also include the interlayer dielectric layer, the planarization layer, and the barrier wall. The first unit includes the substrate, in other words, the edge region is a portion of the substrate exceeding the planarization layer.

It is apparent that the displaying function structure 11 also includes a thin film transistor structure layer disposed under the planarization layer 113, which is known in the prior art and will not be described specifically. Therefore, the second unit can also include a gate electrode insulation layer, or can include a gate electrode insulation layer and a buffer layer.

Figure 4:
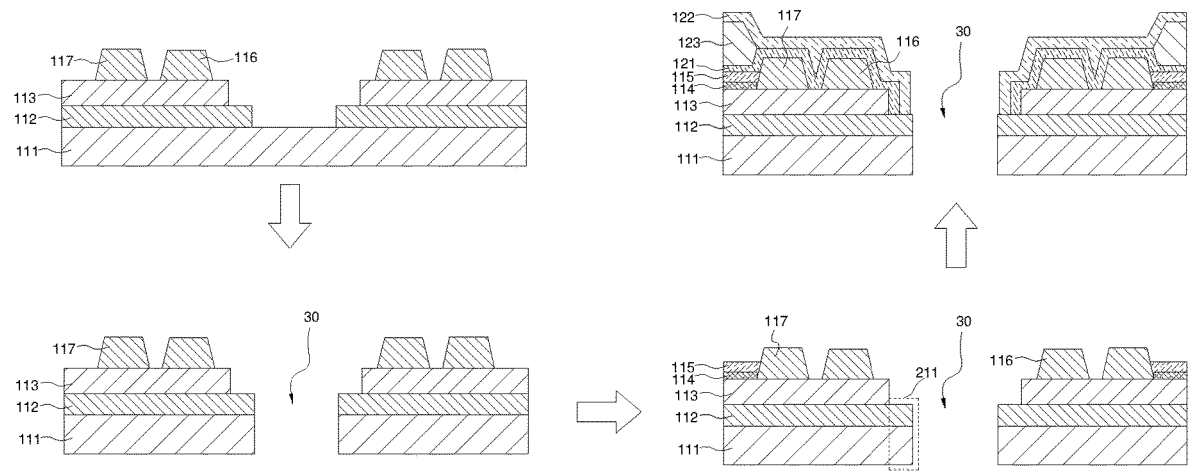
FIG. 4 is a flowchart of the OLED display panel of the first embodiment of the present invention.

With reference to FIG. 4, a manufacturing process of the OLED display panel 100 of the first embodiment is as follows.

A first step includes providing a substrate 111. The substrate 111 includes an opening disposing region configured to disposing openings, a barrier disposing region disposed around a periphery of the opening disposing region and a display disposing region disposed on an outer side of a periphery of the barrier disposing region.

Manufacturing a thin film transistor array structure layer on the substrate 111 includes a buffer layer (not marked in the figures), an active layer (not marked in the figures), a first insulation layer (not marked in the figures), a gate electrode metal layer (not marked in the figures), a second insulation layer (not marked in the figures), a source/drain metal layer (not marked in the figures), an interlayer dielectric layer 112, a planarization layer 113, a pixel definition layer 117, and a barrier wall 116. By a laser cutting process or a photolithographic process, the interlayer dielectric layer 112, the planarization layer 113, and the pixel definition layer 117 of the opening disposing region are processed to form holes. During forming the holes, a film layer region of the interlayer dielectric layer 112 is greater than a film layer region of the planarization layer 113 to form an edge region 211. The barrier wall 116 and the pixel definition layer 117 are made by a same mask, and the barrier wall 116 are located in the barrier disposing region.

A second step includes by a laser cutting process cutting off the opening region of the substrate 111 to obtain a substrate 111 having through holes.

A third step includes cleaning the cut substrate 111 and implementing a vapor deposition process. An organic light emitting material is deposited in the opening of the pixel definition layer 117 through a fine metal mask plate to form an organic light emitting layer 114. A cathode layer 115 is formed on the organic light emitting layer 114. The opening region is disposed without any coating. The display disposing region is formed with a displaying function structure 11, and the barrier disposing region is formed with a barrier structure 20.

Finally, the encapsulation structure layer 12 is disposed. The first inorganic layer 121 by an atomic layer deposition (ALD) process is disposed on the displaying function structure 11 and the barrier structure 20, and is connected to the interlayer dielectric layer 112 of the edge region 211.

An organic layer 123 by an inkjet printing (IJP) technology is printed on a place of the first inorganic layer 121 corresponding to the displaying function structure 11. The barrier wall 116 performs an obstructing function of preventing material of the organic layer 123 from overflowing into the opening region.

The second inorganic layer 122 by the ALD process is deposited on the organic layer 123 and the barrier structure 20, and is connected to the interlayer dielectric layer 112 of the edge region 211.

The manufacturing process of the first embodiment is therefore completed.

The first inorganic layer 121 and the second inorganic layer 122 are deposited by the ALD process because a step coverage rate of the ALD process is very high, which facilitates the first inorganic layer 121 and the second inorganic layer 122 completely covering the second unit 22 of the barrier structure 20.

Figure 5:
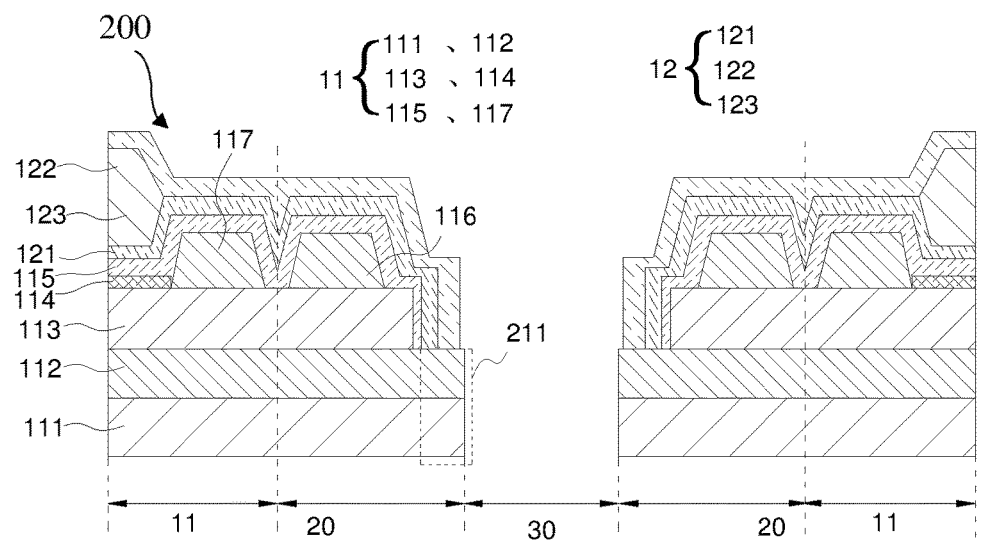
FIG. 5 is a schematic structural view of the OLED display panel of a second embodiment of the present invention.
Figure 6:
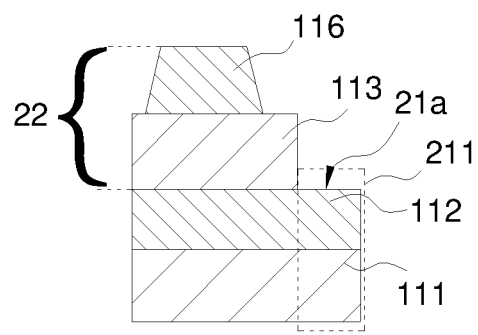
FIG. 6 is a schematic view of a barrier structure of the OLED display panel of the second embodiment of the present invention.

With reference to FIGS. 5 and 6, FIG. 5 is a schematic structural view of the OLED display panel of a second embodiment of the present invention, FIG. 6 is a schematic view of a barrier structure of the OLED display panel of the second embodiment of the present invention. In the second embodiment, the barrier structure 20 includes a substrate 111, an interlayer dielectric layer 112 disposed on the substrate 111, a planarization layer 113 disposed on the interlayer dielectric layer 112, and at least one barrier wall 116 disposed on the planarization layer 113. The displaying function structure 11 includes the substrate 111, the interlayer dielectric layer 112, the planarization layer 113, a pixel definition layer 117, an organic light emitting layer 114, and a cathode layer 115. The encapsulation structure layer 12 includes the first inorganic layer 121, the second inorganic layer 122, and the organic layer 123. The first inorganic layer 121 is disposed on the cathode layer 115.

One difference of the second embodiment from the first embodiment is that the cathode layer 115 extends to barrier structure 20 and covers the second unit 22. The cathode layer 115 extends to an edge region 211 and is connected to the first surface 21a.

The OLED display panel 200 of the second embodiment, extends the cathode layer 115 from the displaying function structure 11 to the barrier structure 20 to cover the second unit 22, and makes the cathode layer 115 extends to and connect with the interlayer dielectric layer 112 of the edge region 211. Such configuration improves sealing performance of the encapsulated second unit 22 to further enhance the effect of preventing water from entering the display region through the through hole 30.

Figure 7:
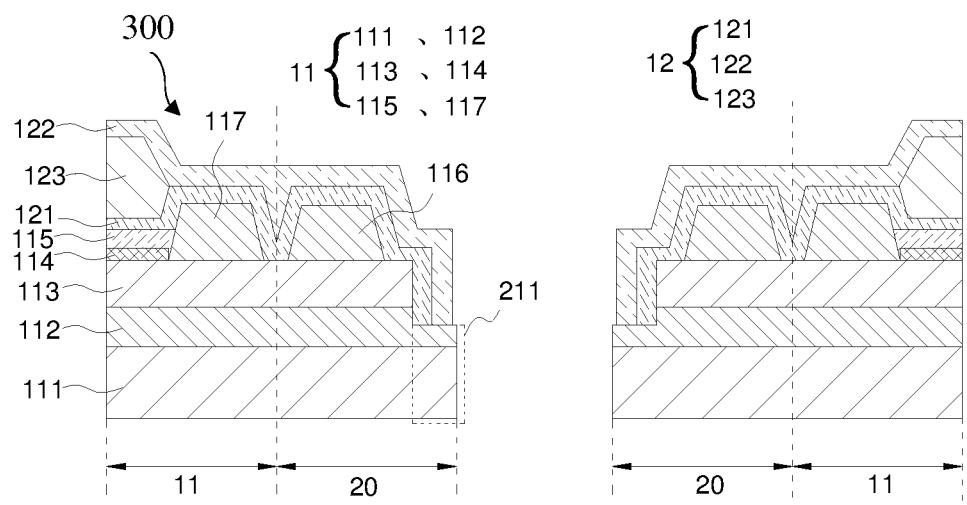
FIG. 7 is a schematic structural view of the OLED display panel of a third embodiment of the present invention.
Figure 8:
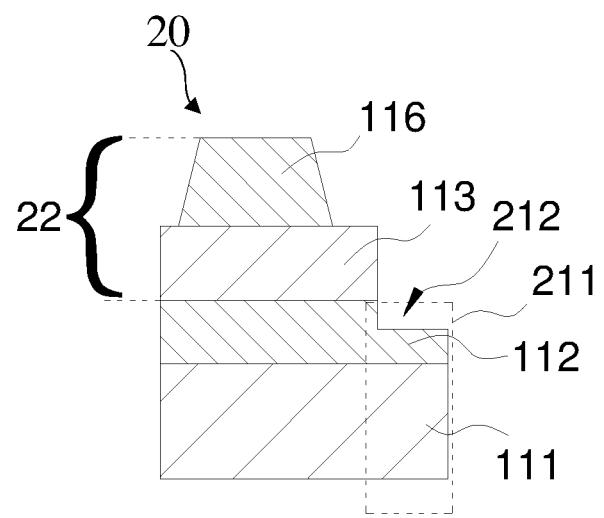
FIG. 8 is a schematic view of a barrier structure of the OLED display panel of the third embodiment of the present invention.

With reference to FIGS. 7 and 8, FIG. 7 is a schematic structural view of the OLED display panel of a third embodiment of the present invention, FIG. 8 is a schematic view of a barrier structure of the OLED display panel of the third embodiment of the present invention. The barrier structure 20 includes a substrate 111, an interlayer dielectric layer 112, a planarization layer 113, and a barrier wall 116. A displaying function structure 11 includes the substrate 111, the interlayer dielectric layer 112, the planarization layer 113, a pixel definition layer 117, an organic light emitting layer 114, and a cathode layer 115. The cathode layer 115 is disposed on the organic light emitting layer 114. An encapsulation structure layer 12 further includes an organic layer 123. The organic layer 123 is disposed between a first inorganic layer 121 and a second inorganic layer 122.

One difference of the third embodiment from the first embodiment is that the edge region 211 is recessed with a notch 212. The first inorganic layer 121 and/or second inorganic layer 122 extends in the notch 212 and is connected to the notch 212. In the third embodiment, the first inorganic layer 121 and the second inorganic layer 122 extends in the notch 212 and is connected to the notch 212.

Such configuration increases a connecting area of the first inorganic layer 121, the second inorganic layer 122, and the edge region 211. In other words, a contact area of the first inorganic layer 121, the second inorganic layer 122, and the interlayer dielectric layer 112 is increased to enhance the encapsulating effect of the first inorganic layer 121 and the second inorganic layer 122 of an OLED display panel 300 of the third embodiment.

Figure 9:
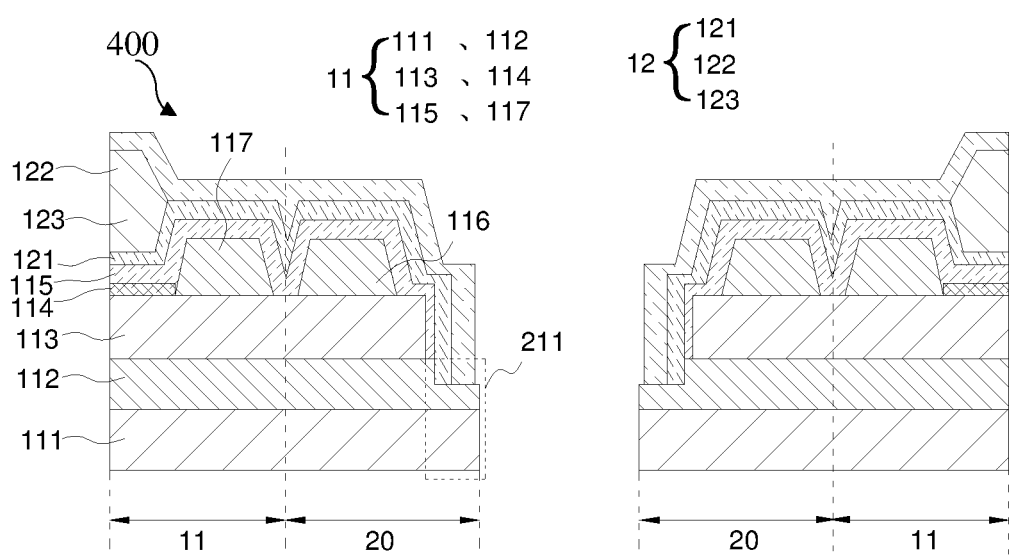
FIG. 9 is a schematic structural view of the OLED display panel of a fourth embodiment of the present invention.
Figure 10:
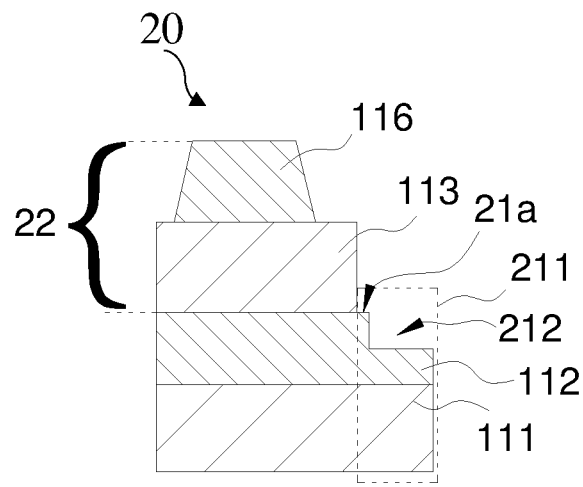
FIG. 10 is a schematic view of a barrier structure of the OLED display panel of the fourth embodiment of the present invention.

With reference to FIGS. 9 and 10, FIG. 9 is a schematic structural view of the OLED display panel of a fourth embodiment of the present invention, FIG. 10 is a schematic view of a barrier structure of the OLED display panel of the fourth embodiment of the present invention. The barrier structure 20 includes a substrate 111, an interlayer dielectric layer 112, a planarization layer 113, and a barrier wall 116. A displaying function structure 11 includes the substrate 111, the interlayer dielectric layer 112, the planarization layer 113, a pixel definition layer 117, an organic light emitting layer 114, and a cathode layer 115. The cathode layer 115 is disposed on the organic light emitting layer 114. An encapsulation structure layer 12 further includes an organic layer 123.

One difference of the fourth embodiment from the second embodiment is that the first surface 21a of the edge region 211 is recessed with the notch 212. The cathode layer 115 is connected to the first surface 21a. The first inorganic layer 121 and/or second inorganic layer 122 extends in the notch 212 and is connected to the notch 212.

In an OLED display panel 400 of the fourth embodiment, to enhance encapsulating effect of a display region, the first inorganic layer 121 and the second inorganic layer 122 are used to connect with the notch 212.

Figure 11:
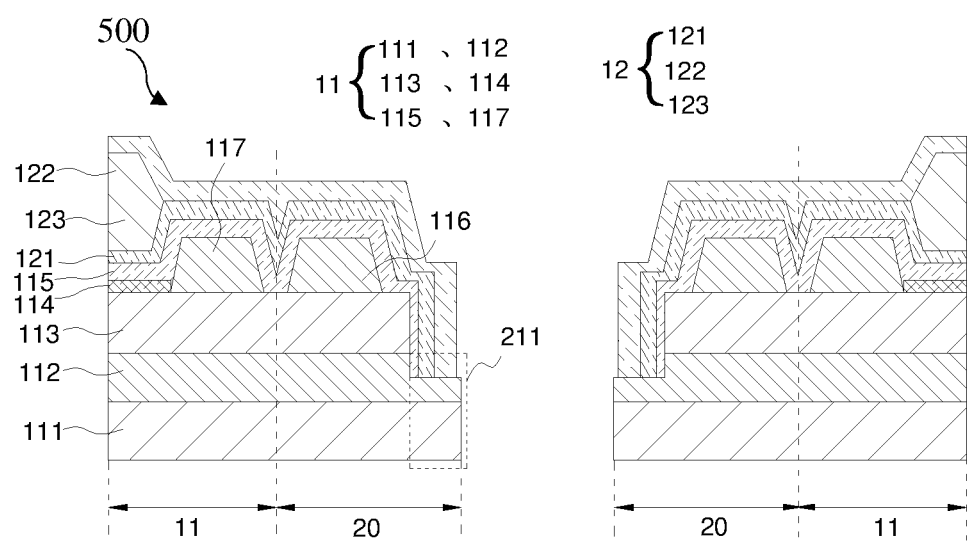
FIG. 11 is a schematic structural view of the OLED display panel of a fifth embodiment of the present invention.
Figure 12:
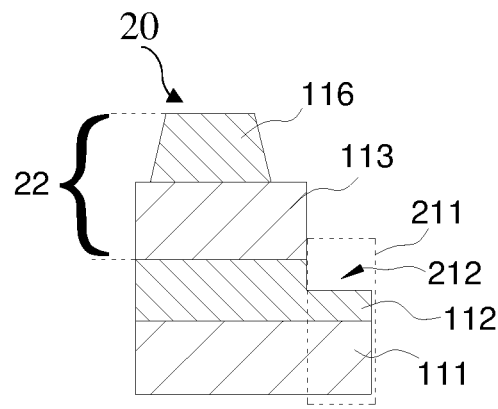
FIG. 12 is a schematic view of a barrier structure of the OLED display panel of the fifth embodiment of the present invention.

With reference to FIGS. 11 and 12, FIG. 11 is a schematic structural view of the OLED display panel of a fifth embodiment of the present invention. FIG. 12 is a schematic view of a barrier structure of the OLED display panel of the fifth embodiment of the present invention. In the fifth embodiment, the barrier structure 20 comprises a substrate 111, an interlayer dielectric layer 112, a planarization layer 113, and a barrier wall 116. A displaying function structure 11 includes the substrate 111, the interlayer dielectric layer 112, the planarization layer 113, a pixel definition layer 117, an organic light emitting layer 114, and a cathode layer 115. The cathode layer 115 is disposed on the organic light emitting layer 114. An encapsulation structure layer 12 further includes an organic layer 123.

One difference of an OLED display panel 500 of the fifth embodiment from the fourth embodiment is that: the edge region 211 is recessed with the notch 212. The cathode layer 115 extends in the notch 212 and is connected to the notch 212. The first inorganic layer 121 and/or the second inorganic layer 122 extends in the notch 212 and is connected to the notch 212.

In the OLED display panel 500 of the fifth embodiment, all of the cathode layer 115, the first inorganic layer 121, and the second inorganic layer 122 are connected to the notch 212, which improves a connection of the three to the interlayer dielectric layer 112 and further enhances a water-repellent capability.

Figure 13:
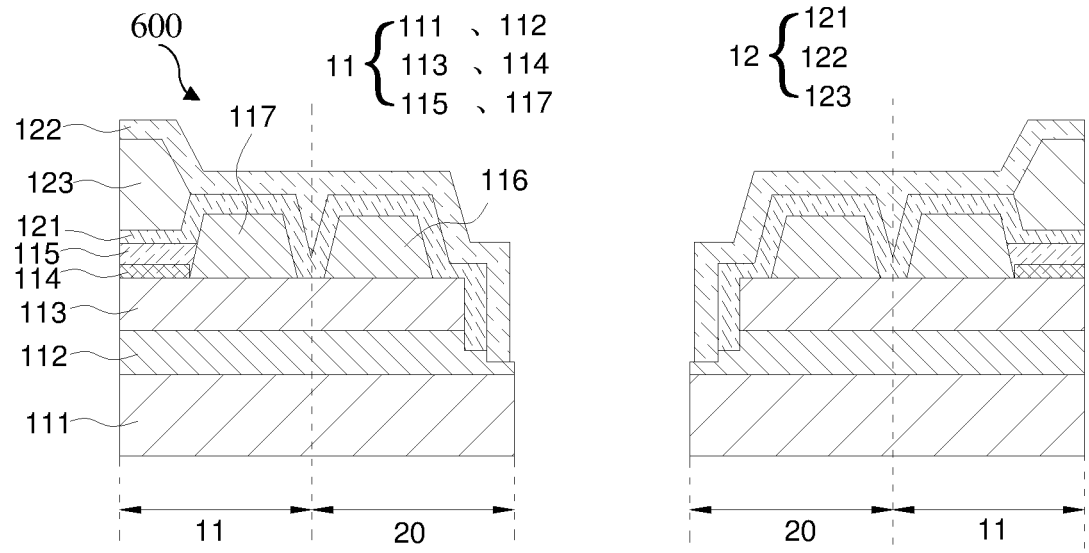
FIG. 13 is a schematic structural view of the OLED display panel of a sixth embodiment of the present invention.
Figure 14:
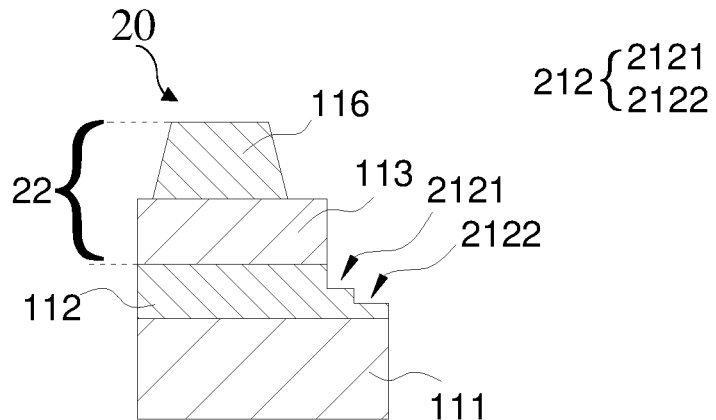
FIG. 14 is a schematic view of a barrier structure of the OLED display panel of the sixth embodiment of the present invention.

With reference to FIGS. 13 and 14, FIG. 13 is a schematic structural view of the OLED display panel of a sixth embodiment of the present invention, FIG. 14 is a schematic view of a barrier structure of the OLED display panel of the sixth embodiment of the present invention. The barrier structure 20 includes a substrate 111, an interlayer dielectric layer 112, a planarization layer 113, and a barrier wall 116. A displaying function structure 11 includes the substrate 111, the interlayer dielectric layer 112, the planarization layer 113, a pixel definition layer 117, an organic light emitting layer 114, and a cathode layer 115. The cathode layer 115 is disposed on the organic light emitting layer 114. The encapsulation structure layer 12 also includes an organic layer 123.

One difference of an OLED display panel 600 of the sixth embodiment from the third embodiment is that the notch 212 includes a first notch portion 2121 and a second notch portion 2122. A depth of the first notch portion 2121 is different from a depth of the second notch portion 2122. The first inorganic layer 121 extends in first notch portion 2121 and is connected to the first notch portion 2121. The second inorganic layer 122 extends in second notch portion 2122 and is connected to the second notch portion 2122.

The sixth embodiment, by an arrangement of different depths of the first notch portion 2121 and the second notch portion 2122, on one hand, increases connecting areas of the first inorganic layer 121 and the second inorganic layer 122 with the interlayer dielectric layer 112, and on the other hand, the sixth embodiment improves encapsulation performance by staggered arrangement.

Figure 15:
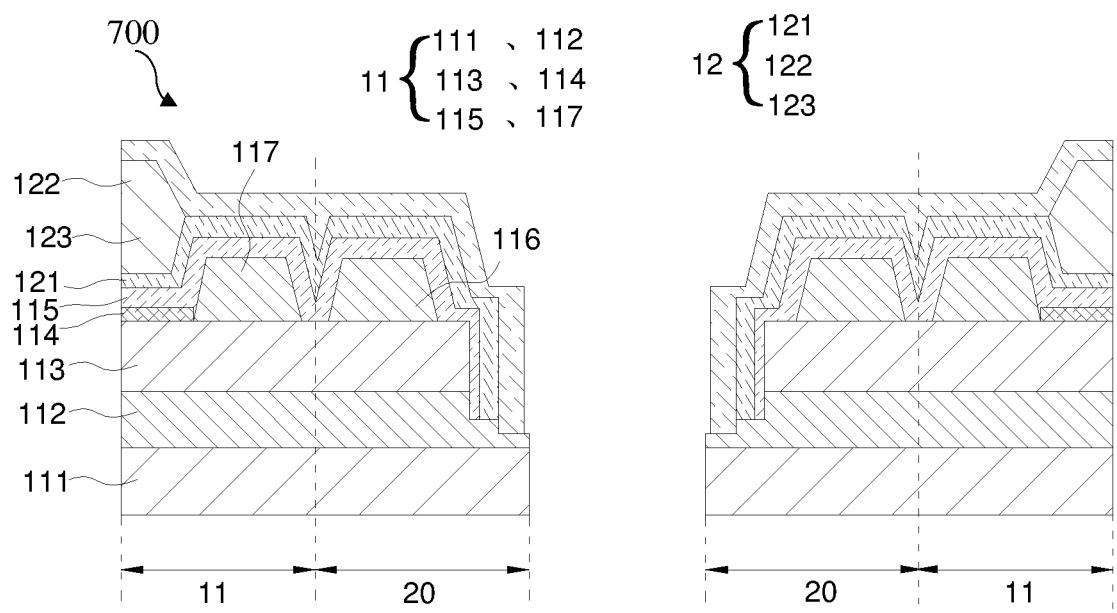
FIG. 15 is a schematic structural view of the OLED display panel of a seventh embodiment of the present invention.
Figure 16:
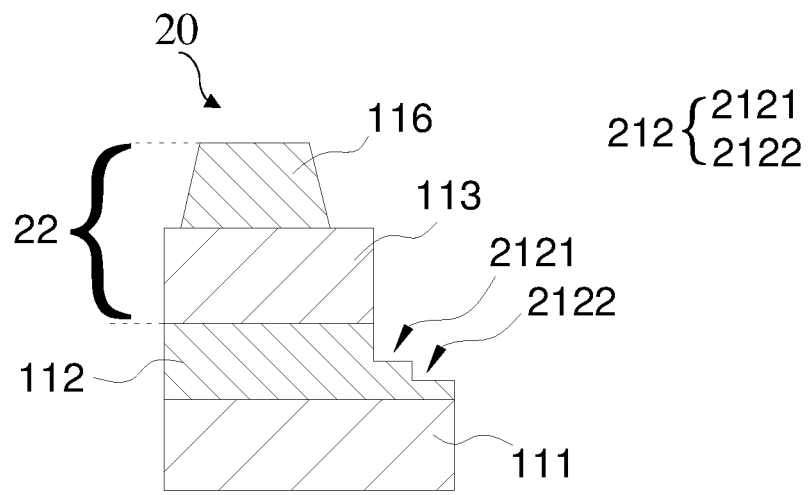
FIG. 16 is a schematic view of a barrier structure of the OLED display panel of the seventh embodiment of the present invention.

With reference to FIGS. 15 and 16, FIG. 15 is a schematic structural view of the OLED display panel of a seventh embodiment of the present invention; FIG. 16 is a schematic view of a barrier structure of the OLED display panel of the seventh embodiment of the present invention. The barrier structure 20 includes a substrate 111, an interlayer dielectric layer 112, a planarization layer 113, and a barrier wall 116. A displaying function structure 11 includes the substrate 111, the interlayer dielectric layer 112, the planarization layer 113, a pixel definition layer 117, an organic light emitting layer 114, and a cathode layer 115. The cathode layer 115 is disposed on the organic light emitting layer 114. An encapsulation structure layer 12 further includes an organic layer 123.

One difference of an OLED display panel 700 of the seventh embodiment from the fifth embodiment is that the notch 212 includes a first notch portion 2121 and second notch portion 2122. A depth of the first notch portion 2121 is different from a depth of the second notch portion 2122. A first inorganic layer 121 and the cathode layer 115 extend in the first notch portion 2121 and are connected to the first notch portion 2121. A second inorganic layer 122 extends in the second notch portion 2122 and is connected to the second notch portion 2122.

Figure 17:
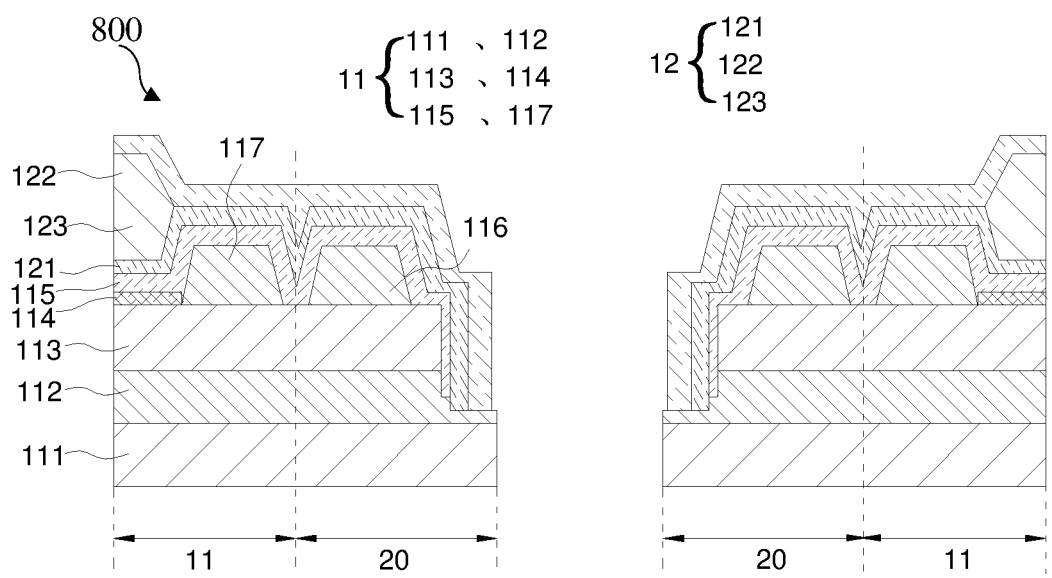
FIG. 17 is a schematic structural view of the OLED display panel of an eighth embodiment of the present invention.
Figure 18:
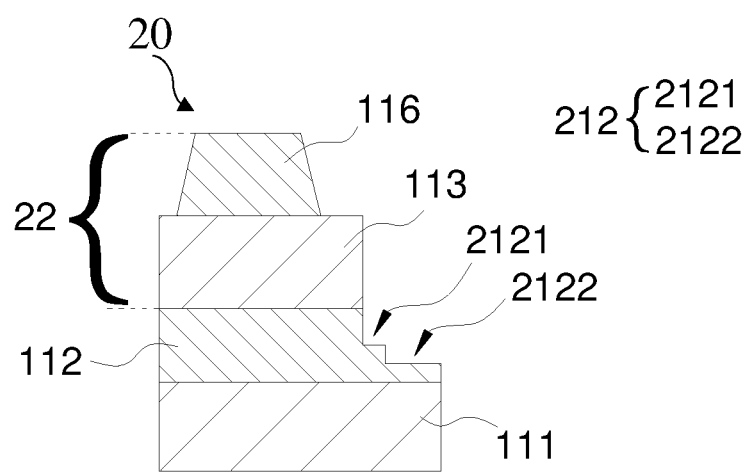
FIG. 18 is a schematic view of a barrier structure of the OLED display panel of the eighth embodiment of the present invention.

With reference to FIGS. 17 and 18, FIG. 17 is a schematic structural view of the OLED display panel of an eighth embodiment of the present invention; FIG. 18 is a schematic view of a barrier structure of the OLED display panel of the eighth embodiment of the present invention. The barrier structure 20 includes a substrate 111, an interlayer dielectric layer 112, a planarization layer 113, and a barrier wall 116. A displaying function structure 11 includes the substrate 111, the interlayer dielectric layer 112, the planarization layer 113, a pixel definition layer 117, an organic light emitting layer 114, and a cathode layer 115. The cathode layer 115 is disposed on the organic light emitting layer 114. An encapsulation structure layer 12 also includes an organic layer 123.

One difference of an OLED display panel 800 of the eighth embodiment from the seventh embodiment is that a notch 212 includes a first notch portion 2121 and a second notch portion 2122. A depth of the first notch portion 2121 is different from a depth of the second notch portion 2122. The cathode layer 115 extends in the first notch portion 2121 and is connected to the first notch portion 2121. A first inorganic layer 121 and a second inorganic layer 122 extend in the second notch portion 2122 and are connected to the second notch portion 2122.

The configuration of the eighth embodiment enhances encapsulating effect of the first inorganic layer 121 and the second inorganic layer 122.

Furthermore, the configuration of the depth of the first notch portion 2121 less than that of the second notch portion 2122 further increases the encapsulating effect of the first inorganic layer 121 and the second inorganic layer 122.

Compared to a conventional OLED display panel, the OLED display panel of the present invention, by extending the encapsulation structure layer from the display region to the barrier structure to cover at least a part of the barrier structure, prevents water from entering the organic light emitting layer of the display region through the through hole, which solves the technical issue that for a conventional O-cut screen, after an OLED device undergoes a thin film encapsulation (TFE) encapsulation process, implementing an O-cut process would make a side of the O-cut screen lose protection of the TFE such that the invasion of water causes failure of the OLED.

As described above, various other changes and modifications can be made by a person skilled in the art in accordance with the technical concept and technical concept of the present invention, and all such changes and modifications should fall within the scope of the appended claims.

What is claimed is:

1. An organic light emitting diode (OLED) display panel, comprising:
    a display region and a through hole configured to receive an electronic element, wherein the display region is disposed around a periphery of the through hole;
    the display region comprising a barrier structure and an encapsulation structure layer covering the barrier structure, wherein the barrier structure is disposed on a side of the periphery of the through hole;
    the barrier structure comprising a first unit and a second unit disposed on the first unit, wherein the encapsulation structure layer covers the second unit;
    the encapsulation structure layer comprising a first inorganic layer, an organic layer, and a second inorganic layer disposed on the organic layer, wherein the first inorganic layer and/or the second inorganic layer covers the second unit;
    wherein the first inorganic layer and/or the second inorganic layer is a single layered structure or a multi-layered structures;
    wherein the first unit comprises an edge region, the edge region is a portion of the first unit exceeding the second unit along a direction toward the through hole, and the edge region comprises a first surface, and the first surface faces the second unit;
    wherein the first inorganic layer and/or the second inorganic layer is connected to the first surface;
    wherein the display region comprises a displaying function structure, the displaying function structure comprises a cathode layer, the first inorganic layer is disposed on the cathode layer, the cathode layer extends to the barrier structure and covers the second unit, and the cathode layer extends to the edge region and is connected to the first surface; and
    wherein the first surface of the edge region is recessed with a notch, the cathode layer is connected to the first surface, and the first inorganic layer and/or the second inorganic layer extends in the notch and is connected to the notch.

2. The OLED display panel as claimed in claim 1, wherein the display region comprises a substrate, an interlayer dielectric layer disposed on the substrate, a planarization layer disposed on the interlayer dielectric layer and at least one barrier wall disposed on the planarization layer, the first unit comprises the substrate and the interlayer dielectric layer, and portions of the substrate and the interlayer dielectric layer exceeding the planarization layer form the edge region.

3. The OLED display panel as claimed in claim 2, wherein the display region further comprises a displaying function structure configured to display light, the displaying function structure is disposed on a side of a periphery of the barrier structure facing away from the through hole, the second unit comprises the planarization layer and the barrier wall, the displaying function structure comprises a pixel definition layer disposed on the planarization layer, and wherein the barrier wall and the pixel definition layer are disposed in a same layer.

4. The OLED display panel as claimed in claim 3, wherein the barrier wall and the pixel definition layer are made by a same mask.

5. An organic light emitting diode (OLED) display panel, comprising:
    a display region and a through hole configured to receive an electronic element, wherein the display region is disposed around a periphery of the through hole; and
    the display region comprising a barrier structure and an encapsulation structure layer covering the barrier structure, wherein the barrier structure is disposed on a side of the periphery of the through hole;
    wherein the barrier structure comprises a first unit, and a second unit disposed on the first unit, wherein the encapsulation structure layer covers the second unit;
    wherein the encapsulation structure layer comprises a first inorganic layer, an organic layer, and a second inorganic layer disposed on the organic layer, wherein the first inorganic layer and/or the second inorganic layer covers the second unit;
    wherein the first unit comprises an edge region, the edge region is a portion of the first unit exceeding the second unit along a direction toward the through hole, and the edge region comprises a first surface, and the first surface faces the second unit; and
    the first inorganic layer and/or the second inorganic layer is connected to the first surface; and
    wherein the display region comprises a displaying function structure, the displaying function structure comprises a cathode layer, the first inorganic layer is disposed on the cathode layer, the cathode layer extends to the barrier structure and covers the second unit, and the cathode layer extends to the edge region and is connected to the first surface; and
    wherein a first surface of the edge region is recessed with a notch, the cathode layer is connected to the first surface, and the first inorganic layer and/or the second inorganic layer extends in the notch and is connected to the notch.

6. The OLED display panel as claimed in claim 5, wherein the display region comprises a substrate, an interlayer dielectric layer disposed on the substrate, a planarization layer disposed on the interlayer dielectric layer and at least one barrier wall disposed on the planarization layer, the first unit comprises the substrate and the interlayer dielectric layer, and portions of the substrate and the interlayer dielectric layer exceeding the planarization layer form the edge region.

7. The OLED display panel as claimed in claim 6, wherein the display region further comprises a displaying function structure configured to display light, the displaying function structure is disposed on a side of a periphery of the barrier structure facing away from the through hole, the second unit comprises the planarization layer and the barrier wall; the displaying function structure comprises a pixel definition layer disposed on the planarization layer, and the barrier wall and the pixel definition layer are disposed in a same layer.

8. The OLED display panel as claimed in claim 7, wherein the barrier wall and the pixel definition layer are made by a same mask.

9. The OLED display panel as claimed in claim 7, wherein the displaying function structure further comprises the substrate, the interlayer dielectric layer, the planarization layer, the pixel definition layer, an organic light emitting layer, and a cathode layer disposed sequentially.

10. An organic light emitting diode (OLED) display panel, comprising:
    a display region and a through hole configured to receive an electronic element, wherein the display region is disposed around a periphery of the through hole;
    the display region comprising a barrier structure and an encapsulation structure layer covering the barrier structure, wherein the barrier structure is disposed on a side of the periphery of the through hole;
    the barrier structure comprising a first unit and a second unit disposed on the first unit, wherein the encapsulation structure layer covers the second unit;
    the encapsulation structure layer comprising a first inorganic layer, an organic layer, and a second inorganic layer disposed on the organic layer, wherein the first inorganic layer and/or the second inorganic layer covers the second unit;
    wherein the first inorganic layer and/or the second inorganic layer is a single layered structure or a multi-layered structure;
    wherein the barrier structure comprises a first unit and a second unit disposed on the first unit, wherein the encapsulation structure layer covers the second unit;
    wherein the encapsulation structure layer comprises a first inorganic layer, an organic layer, and a second inorganic layer disposed on the organic layer, wherein the first inorganic layer and/or the second inorganic layer covers the second unit;
    wherein the first unit comprises an edge region, the edge region is a portion of the first unit exceeding the second unit along a direction toward the through hole, and the edge region comprises a first surface, and the first surface faces the second unit; and
    the first inorganic layer and/or the second inorganic layer is connected to the first surface; and
    wherein the display region comprises a displaying function structure, the displaying function structure comprises a cathode layer, the first inorganic layer is disposed on the cathode layer, the cathode layer extends to the barrier structure and covers the second unit, and the cathode layer extends to the edge region and is connected to the first surface; and
    wherein the edge region is recessed with a notch, the cathode layer extends in the notch and is connected to the notch, the cathode layer is connected to the first surface, and the first inorganic layer and/or the second inorganic layer extends in the notch and is connected to the notch.

\* \* \* \* \*